(12) United States Patent
Rusnak, II et al.

(10) Patent No.: US 12,525,965 B2
(45) Date of Patent: Jan. 13, 2026

(54) FAST-CHARGE PULSE SHAPING CIRCUIT

(71) Applicant: pSemi Corporation, San Diego, CA (US)

(72) Inventors: Richard Steve Rusnak, II, San Diego, CA (US); Jing Li, San Diego, CA (US); Sivakumar Ganesan, Austin, TX (US)

(73) Assignee: pSemi Corporation, San Diego, CA (US)

( * ) Notice: Subject to any disclaimer, the term of this patent is extended or adjusted under 35 U.S.C. 154(b) by 41 days.

(21) Appl. No.: 18/394,826

(22) Filed: Dec. 22, 2023

(65) Prior Publication Data

US 2025/0211214 A1 Jun. 26, 2025

(51) Int. Cl.
*H03K 5/02* (2006.01)
*H03F 3/24* (2006.01)
*H03K 5/1252* (2006.01)

(52) U.S. Cl.
CPC ............ *H03K 5/023* (2013.01); *H03F 3/245* (2013.01); *H03K 5/1252* (2013.01); *H03F 2200/294* (2013.01); *H03F 2200/451* (2013.01)

(58) Field of Classification Search
CPC ........ H03K 5/023; H03K 5/1252; H03K 5/01; H03K 5/04; H03K 5/06; H03K 5/12; H03K 5/1254; H03K 3/017; H03K 4/00; H03K 4/56; H03K 7/08; H03F 3/245; H03F 2200/294; H03F 2200/451
See application file for complete search history.

(56) References Cited

U.S. PATENT DOCUMENTS

| | | |
|---|---|---|
| 9,755,595 B1 | 9/2017 | Lin |
| 10,084,415 B1 | 9/2018 | Klaren |
| 11,329,642 B1 * | 5/2022 | Shrivastava ..... H03K 17/04123 |

FOREIGN PATENT DOCUMENTS

EP 3547536 A1 10/2019

OTHER PUBLICATIONS

International Search Report and Written Opinion issued for International PCT Application No. PCT/US2024/056298 filed on Nov. 15, 2024 on behalf of pSemi Corporation. Mail Date: Apr. 29, 2025. 21 pages.

* cited by examiner

*Primary Examiner* — Jung Kim
(74) *Attorney, Agent, or Firm* — Steinfl + Bruno LLP

(57) ABSTRACT

Fast-charge shaping circuits and methods for shaping the output of a fast-charge one-shot circuit so as to more precisely shape a fast-charge pulse to a bypass switch placed in parallel with an LNA bias resistor in order to decrease the response time of the LNA to circuit mode changes while minimizing perturbations. Accordingly, the settling time of the LNA during mode changes is less dependent on bias resistance, thereby enabling a Noise Figure improvement. A first approach staggers the release of a fast-charge pulse or pulses over multiple resistor segments to gradually increase the effective resistance of bias resistors. A second approach applies a diode and RC filter to a fast-charge pulse to shape the pulse to gradually increase the effective resistance of bias resistors. A third approach uses an op-amp and timing circuit to control the fast-charge pulse shape to gradually increase the effective resistance of bias resistors.

20 Claims, 17 Drawing Sheets

FAST-CHARGE PULSE SHAPING CIRCUIT

BACKGROUND

(1) Technical Field

This invention relates to electronic circuitry, and more particularly to bias circuits for radio frequency low noise amplifiers.

(2) Background

Modern radio frequency (RF) receivers typically include a "front end" that generally includes at least one low noise amplifier ("LNA"). An LNA is responsible for providing the first stage of amplification for a received RF signal. In many applications, multiple LNAs are needed to cover all frequencies in one or more bands. FIG. 1 is a schematic diagram of a prior art LNA 100. In the illustrated example, a cascode reference circuit 102 includes a pair of series-connected transistors M1 and M2 connected between a current source 104 supplied by a voltage input $V_{DD1}$ and an optional degeneration inductor L1, which in turn is connected to circuit ground. The cascode reference circuit 102 provides accurate current levels to a low noise amplifier (LNA) circuit 106. The LNA circuit 106 includes series-connected transistors M3 and M4 connected between a voltage input $V_{DD2}$ (which may be the same a $V_{DD1}$) through a load matching circuit 108 and an optional degeneration inductor L2, which in turn is connected to circuit ground. The output of the LNA 100 is coupled through an output capacitor COUT connected to transistor M4.

First and second bias circuits 110a, 110b are respectively coupled to the gates of the series-connected transistors M1 and M2. The second bias circuit 110b is also coupled through a first filter 112 (e.g., an RC filter) to the gate of transistor M4. The first bias circuit 110a is also coupled to the gate of transistor M3 along a signal path from node V1 to node V2, where the signal path includes a second filter 114 (e.g., an RC filter) and a bias-path resistor R1. The resistor R1 preferably provides a high impedance between the first bias circuit 110a and the LNA circuit 106.

Node V2 is connected to the gate of transistor M3. In some embodiments, a third filter 116 that includes a DC blocking capacitor CB may be coupled between node V2 and the gate of transistor M3. Note that in the illustrated example, the third filter 116 includes a resistor Rg; however, in some embodiments, that resistor Rg may be omitted by relying on the resistor R1. R1 may be quite large to minimize its impact on Noise Figure (NF). An RF input signal, $RF_{IN}$, from an RF source (not shown) may be applied through the DC blocking capacitor CB to the gate of transistor M3. In other embodiments (which may be referred to as "cap-less LNAs"), an $RF_{IN}$ signal may be applied directly to the gate of transistor M3 without going through a DC blocking capacitor CB. Note that an RF source has a source impedance that is generally a function of frequency. In some cases, the source impedance within the frequency range corresponding to required transition times may have a significant impact on the transition response of the LNA 100. If a DC blocking capacitor CB is used as part of the design, the capacitor essentially isolates the LNA 100 from the source impedance in the base-band frequency range. If a DC blocking capacitor is not used, the design must overcome the effects of the base-band source impedance, which makes transition control more difficult.

The transistors M1, M2, M3, M4 may be, for example, field-effect transistors (FET), and in particular, may be metal-oxide-semiconductor FETs (MOSFETs). The transistors M1, M2 of the cascode reference circuit 102 can be regarded as part of a "DC" subcircuit that monitors and set DC currents in themselves and thereby define voltages (and therefore currents) in the RF-side LNA circuit 106 while being isolated from the LNA circuit 106 (in this example, by the first and second filters 112, 114). Note that the cascode reference circuit 102 is optional in some embodiments.

One desirable characteristic in LNAs is a fast response time during a mode change, such as when switching any of gain, bias, and/or band. In the example illustrated in FIG. 1, the voltage V1 (at the similarly-named node V1) can rapidly change from a low-to-high voltage when the LNA is powered up (for example, from a "sleep" mode when transitioning from transmitting to receiving) due to the fast settling of the bias circuit 110a. However, the voltage V2 (at the similarly-named node V2) rises relatively slowly, owing to the relatively large RC time constant resulting from resistor R1, the second filter 114, the gate-to-source capacitance Cgs of input transistor M3, and any capacitance coupled to $RF_{IN}$ (e.g., from filters, switches, parasitic capacitance, etc.). Thus, the settling time at V1 is fast, based on the response time of the bias circuit 110a, but the settling time at V2 is much slower than at V1 due to the noted large RC time constant.

A conventional solution to overcome the large RC time constant problem is to couple a switch Sw (e.g., a FET) in parallel with resistor R1, and set the ON (conducting) state of the switch Sw by a pulse from a fast-charge one-shot (FCOS) circuit 120. The pulse output of the FCOS circuit is typically initiated by a trigger signal from a controller 124 (e.g., a MIPI-compliant controller) sent, for example, when there is gain/bias/band mode switching. The trigger signal from the controller 124 is applied to a conventional one-shot circuit 122, which generates the actual pulse applied to the switch Sw. Assertion of the pulse causes switch Sw to close, thereby bypassing resistor R1 and effectively reducing the RC constant of the signal path between the V1 node and the gate of transistor M3. Accordingly, V2 can rapidly charge.

A problem with conventional FCOS circuits 120 is that the width of the output pulse is fixed. Accordingly, the pulse width is generally chosen to be sufficiently wide (for example, 20-30% over an expected design value) to accommodate process/voltage/temperature (PVT) variations between parts. Such a large "safety margin" often leaves only a very small time from the falling edge of the pulse to meet a timing specification (generally set by a customer), noting that it still takes time for the final voltage to settle after the completion of the assertion of the pulse from the FCOS circuit due to the charge injection through the switch Sw.

In light of the timing margin problems of the FCOS circuit 120, there is room for improvement, particularly when the gate of the LNA input transistor is directly coupled to external components. The present invention provides an improvement to the circuitry shown in FIG. 1.

SUMMARY

The present invention encompasses fast-charge pulse shaping circuits and methods for modifying the output of a fast-charge one-shot (FCOS) circuit so as to more precisely control a fast-charge pulse to a bypass switch placed in parallel with an LNA bias resistor in order to decrease the response time of the LNA to mode changes (e.g., gain transitions) while minimizing perturbations. As a result, the settling time of the LNA during mode changes is less dependent on bias resistance. Accordingly, the bias resistance does not become a limiting factor in terms of Noise Figure improvement. In addition, embodiments of the novel fast-charge circuit are simple and consume low power.

The present disclosure describes three circuits and corresponding methods that overcome the existing tradeoff between LNA gain transition settling time and LNA Noise Figure. In essence, a fast-charge pulse shaping circuit is inserted between at least one FCOS circuit and the control gate of at least one bypass switch placed in parallel with a corresponding LNA bias resistor. A first approach (which may be implemented in different ways) staggers the release of a fast-charge pulse or pulses from one or more FCOS circuits over multiple resistor segments so as to gradually increase the effective bias resistance. A second approach applies a diode (which may be implemented in different ways) and RC filter to a fast-charge pulse to shape the pulse so as to gradually increase the effective bias resistance. A third approach uses an op-amp and a timing circuit to precisely control the fast-charge pulse shape so as to gradually increase the effective bias resistance.

The details of one or more embodiments of the invention are set forth in the accompanying drawings and the description below. Other features, objects, and advantages of the invention should be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses fast-charge pulse shaping circuits and methods for modifying the output of a fast-charge one-shot (FCOS) circuit so as to more precisely control a fast-charge pulse to a bypass switch placed in parallel with an LNA input resistor in order to decrease the response time of the LNA to mode changes (e.g., gain transitions) while minimizing perturbations. As a result, the settling time of the LNA during mode changes is less dependent on bias resistance. Accordingly, the bias resistance does not become a limiting factor in terms of Noise Figure improvement. In addition, embodiments of the novel fast-charge circuit are simple and consume low power.

Figure 1:
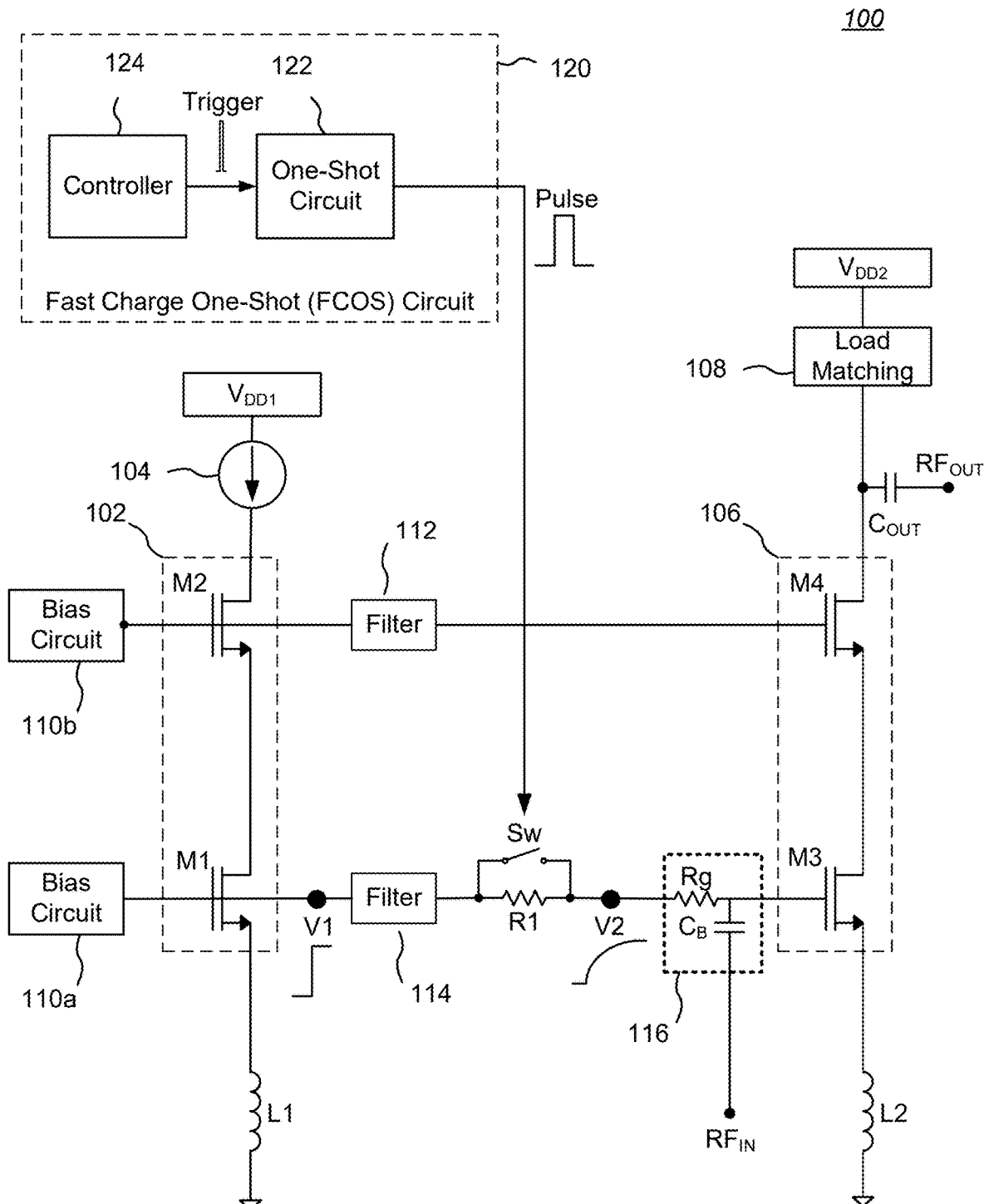
FIG. 1 is a schematic diagram of a prior art LNA.
Figure 2:
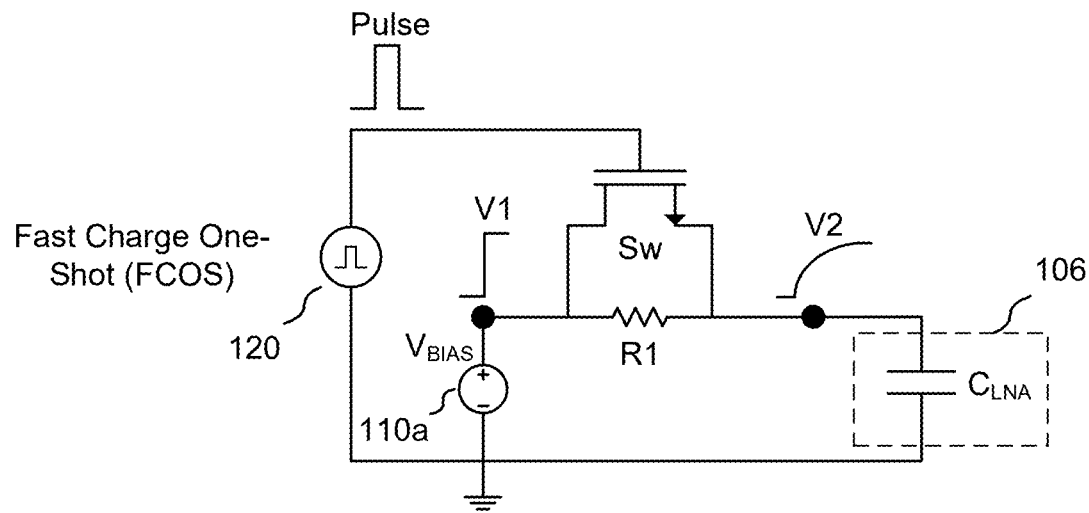
FIG. 2 is a schematic diagram of an equivalent circuit for the LNA of FIG. 1 with the LNA circuit and associated parasitic capacitances modeled as a capacitor $C_{LNA}$.

For ease of understanding the improvements of the present invention, it is useful to refer to a simplified equivalent circuit for the LNA 100 of FIG. 1. For example, FIG. 2 is a schematic diagram of an equivalent circuit for the LNA 100 of FIG. 1 with the LNA circuit 106 and associated parasitic capacitances modeled as a capacitor $C_{LNA}$. A perennial problem with LNAs is that noise from an LNA's bias circuit 110a can degrade the Noise Figure (NF) of the LNA 100, a key distinguishing metric for an amplifier. A large series resistance R1 (e.g., 100 kΩ) from node V1 to node V2 reduces bias noise coupling into the LNA circuit 106 but results in a long gain transition settling time. A small value of R1 (e.g., 10 kΩ) would enable quick charging and discharging of node V2 but would result in a high NF value if permanently part of the V1-to-V2 signal path. Smaller values for R1 can also cause degradation of the LNA's NF due to the thermal noise of the resistor itself.

Figure 3:
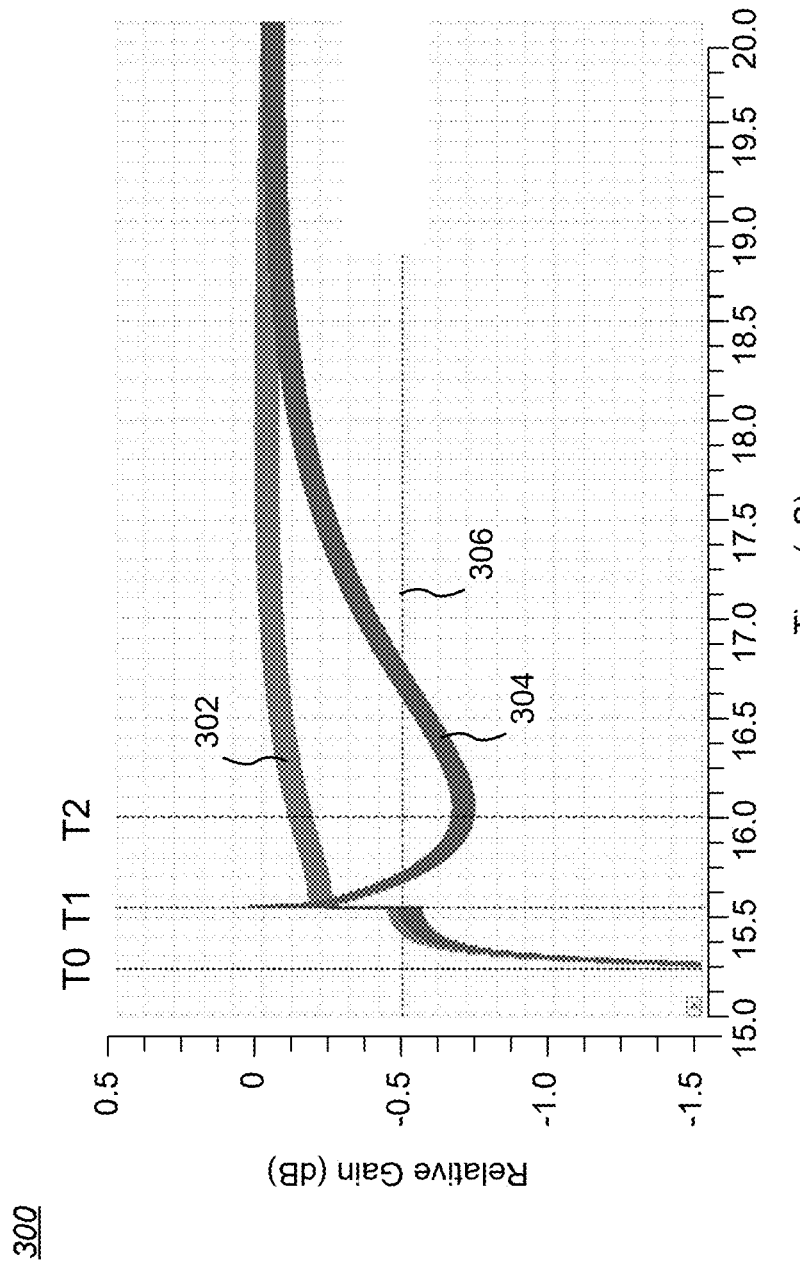
FIG. 3 is a graph of relative gain as a function of time for an example LNA without an input DC blocking capacitor.

LNAs without an input DC blocking cap ("cap-less LNAs") sometimes show a unique transient phenomenon when using only a standard FCOS circuit 120 that can make meeting a tight timing specification (generally set by a customer) difficult. For example, FIG. 3 is a graph 300 of relative gain as a function of time for an example LNA without an input DC blocking capacitor. Graph line 302 represents the relative gain of the LNA when R1=10 kΩ and graph line 304 represents the relative gain of the LNA when R1=100 kΩ. Time T0 indicates the gain levels of the LNA at the commencement of a fast-charge pulse from the FCOS circuit 120 and time T1 indicates the gain levels of the LNA at the end of the fast-charge pulse from the FCOS circuit 120.

At time T1, the LNA using the existing FCOS circuit 120 settles to an intermediate LNA state indicated by dotted line

306. However, some time must be allowed after the end of fast-charge pulse for the LNA 100 to finish settling. One settling metric is the time after which the LNA gain stays within some range of its final value. For example, if the specification is that the gain transition settling time must be ±0.5 dB by 1 µS after time T1 (i.e., by time T2 at 16 µS in this example), then the LNA configuration represented by graph line 302 would meet the specification but with a poor NF value due to the low value of R1. On the other hand, the LNA configuration represented by graph line 304 would fail the specification but would have a good NF value due to the high value of R1. In particular, the gain of a cap-less LNA architecture with a high value for R1 can often droop after the fast-charge pulse ends at time T1, exacerbating the issue of meeting the specification. Accordingly, a very tight gain transition settling time specification with a good NF value may not be achievable with a standard FCOS circuit 120.

The present disclosure describes three circuits and corresponding methods that substantially eliminate the existing tradeoff between LNA gain transition settling time and LNA NF. In essence, a fast-charge pulse shaping circuit is inserted between at least one FCOS circuit 120 and the control gate of at least one bypass switch Sw placed in parallel with a corresponding LNA bias resistor. A first approach (which may be implemented in different ways) staggers the release of a fast-charge pulse or pulses from one or more FCOS circuits 120 over multiple resistor segments so as to gradually increase the effective bias resistance to the gate of the LNA input transistor. A second approach applies a diode (which may be implemented in different ways) and RC filter to a fast-charge pulse from an FCOS circuit 120 to shape the pulse so as to gradually increase the effective resistance of the bias resistor. A third approach uses an op-amp and a timing circuit to precisely control the fast-charge pulse shape so as to gradually increase the effective resistance of the bias resistor.

Figure 4:
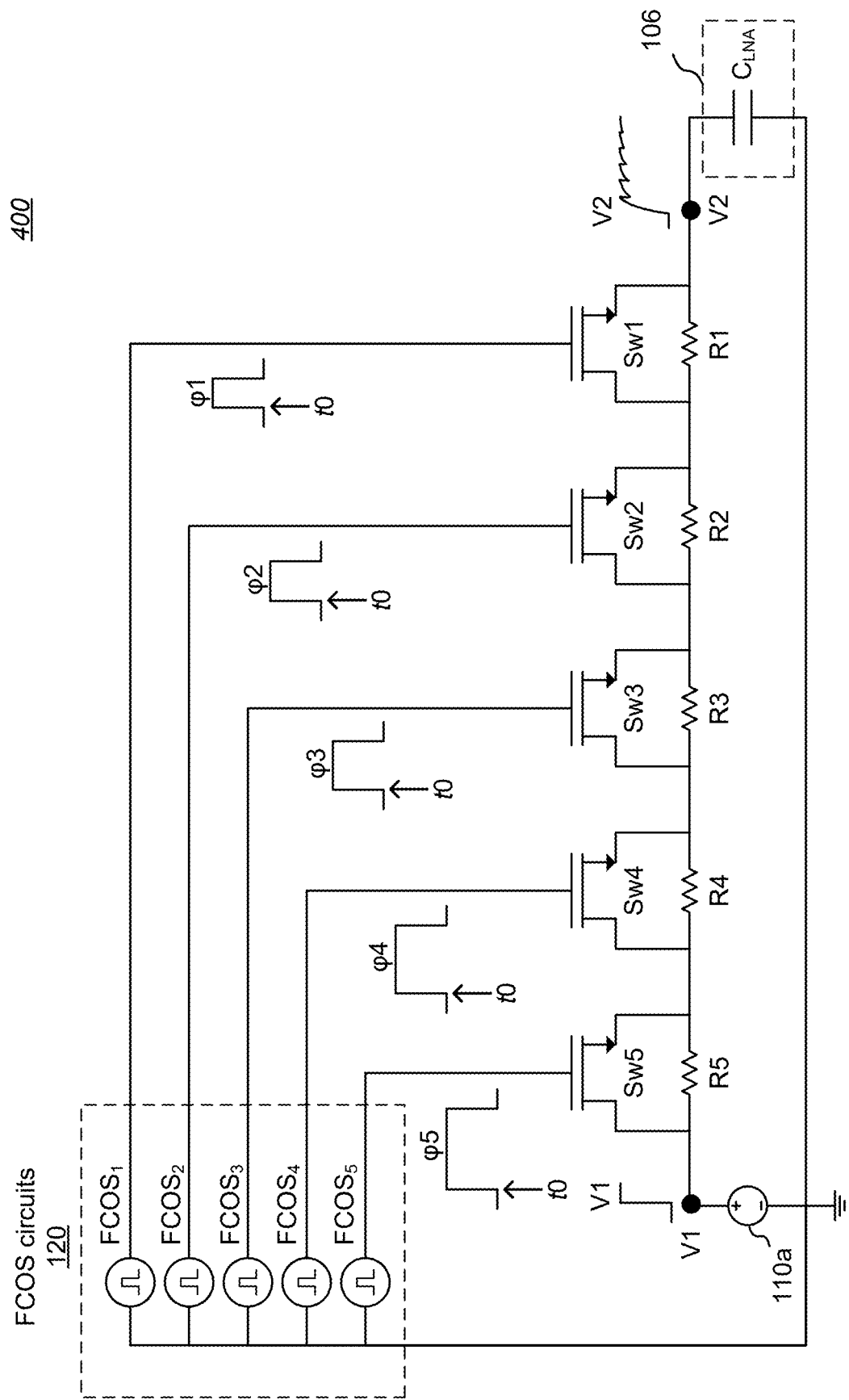
FIG. 4 is a schematic diagram of a first LNA bias circuit having a fast-charge pulse shaping circuit that staggers the release of multiple fast-charge pulses over multiple resistor segments.

FIG. 4 is a schematic diagram of a first LNA bias circuit 400 having a fast-charge pulse shaping circuit that staggers the release of multiple fast-charge pulses over multiple resistor segments. In the illustrated example, five resistors R1-R5 are connected in series between a bias circuit 110a node V1 and a node V2. A capacitor $C_{LNA}$ coupled to the V2 node represents the equivalent capacitance of the LNA circuit 106 of FIG. 1.

The resistors R1-R5 may each have a resistance value, for example, of 20 kΩ, for a total series resistance of 100 kΩ. However, in some embodiments, the values of resistors R1-R5 may be different. Each resistor R1-R5 has an associated bypass switch Sw1-Sw5, represented as FETs in this example. In the illustrated example, the control gate of each bypass switch Sw1-Sw5 is coupled to its own fast-charge one-shot circuit $FCOS_1$-$FCOS_5$ (generically, "FCOSx"), each triggered by the assertion of a low-to-high transition at node V1. In the illustrated example, each FCOSx outputs a fast-charge pulse having a unique duration. For example, the output pulse φ1 of $FCOS_1$ may have a duration of 600 nS while the output pulse φ5 of $FCOS_5$ may have a duration of 3000 nS, with the unique durations of the output pulses φ2-φ4 being somewhere in between (e.g., the duration sequence may be evenly spaced at 600 nS, 1200 nS, 1800 nS, 2400 nS, and 3000 nS, but the durations of the output pulses need not be evenly spaced and may have beginning and end values different from 600 nS and 3000 nS, respectively). However, in some embodiments, the durations of at least some of the output pulses may be the same (e.g., when more than one resistor is to be un-bypassed at the same time).

As described above, the voltage V1 (at the similarly-named node V1) can rapidly increase or decrease when the LNA is powered up or during some gain mode transitions due to the fast settling of the bias circuit 110a; FIG. 4 shows a change from a low-to-high voltage at node V1. To achieve a fast LNA gain transition settling time, resulting in the illustrated voltage waveform V2 (at the similarly-named node V2), the resistors R1-R5 are initially all bypassed by having each $FCOS_1$-$FCOS_5$ output its corresponding output pulse φ1-φ5 (transitioning from low to high at the same point in time, t0) when the voltage at node V1 goes high, thus turning all of the bypass switches Sw1-Sw5 to an ON (conducting) state. The result is that node V1 is coupled to node V2 directly, with only the slight ON resistance $R_{ON}$ of the switches Sw1-Sw5 impeding flow of charge from node V1 to node V2. Rapid transfer of charge to node V2 charges the capacitor $C_{LNA}$, which represents at least the gate capacitance of the input FET of the LNA circuit 106.

After output pulse φ1 times out (returns from high to low), bypass switch Sw1 will switch to an OFF (blocking) state, and resistor R1 will be engaged to impede the flow of charge from node V1 to node V2. Thereafter, output pulse φ2 times out and bypass switch Sw2 switches to an OFF state, thereby engaging resistor R2 to impede the flow of charge from node V1 to node V2. The process proceeds in a similar fashion as output pulse φ3 times out (engaging R3), output pulse φ4 times out (engaging R4), and output pulse φ5 times out (engaging R5).

After all output pulses φ1-φ5 have expired (returned to low), nodes V1 and V2 will be separated by the total series resistance of resistors R1-R5. The overall result is that gain excursions in the LNA bias circuit 400 are broken into small, quickly-settling steps while achieving a fast LNA gain transition settling time. Further, a larger total bias resistance may be used, thus improving the NF for the LNA. Moreover, segments of resistors and bypass switches may have arbitrary values of resistance and bypass duration, so the resulting waveform at node V2 may be optimized for different applications.

Figure 5:
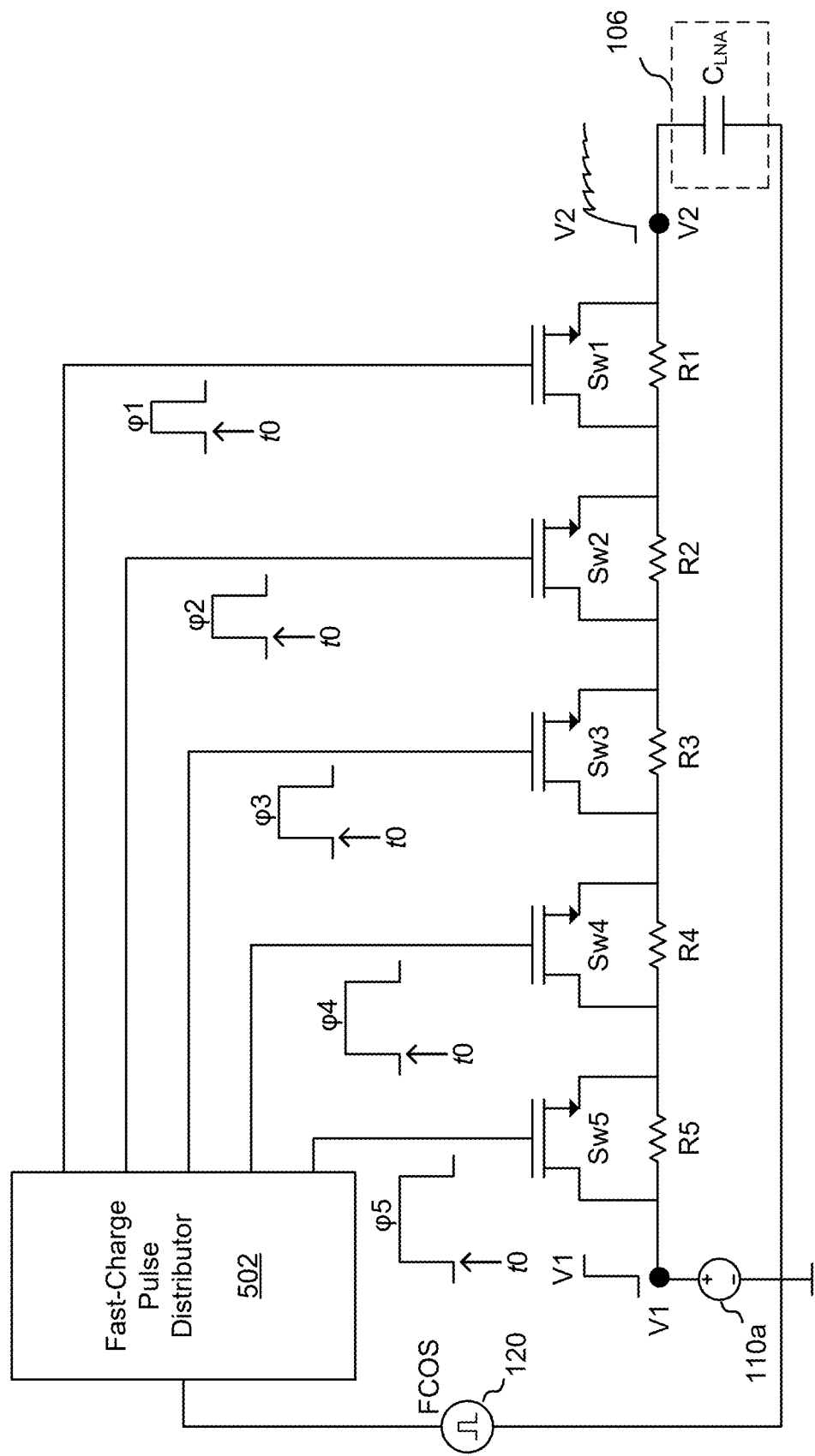
FIG. 5 is a schematic diagram of a second LNA bias circuit having a fast-charge pulse shaping circuit that staggers the release of multiple fast-charge pulses over multiple resistor segments.

FIG. 5 is a schematic diagram of a second LNA bias circuit 500 having a fast-charge pulse shaping circuit that staggers the release of multiple fast-charge pulses over multiple resistor segments. While similar in most aspects to the LNA bias circuit 400 of FIG. 4, a single FCOS circuit 120 provides a fast-charge pulse to a fast-charge pulse distributor 502 which generates and outputs a set of output pulses φ1-φ5 to respective ones of the control gates of the bypass switches Sw1-Sw5. The fast-charge pulse distributor 502 may be implemented, as one example, as a set of five conventional pulse-extender circuits (also known as pulse-stretcher circuits) each being set to a different duration in order to generate the pulses φ1-φ5. Operation is as described above for the LNA bias circuit 500 of FIG. 5.

Figure 6:
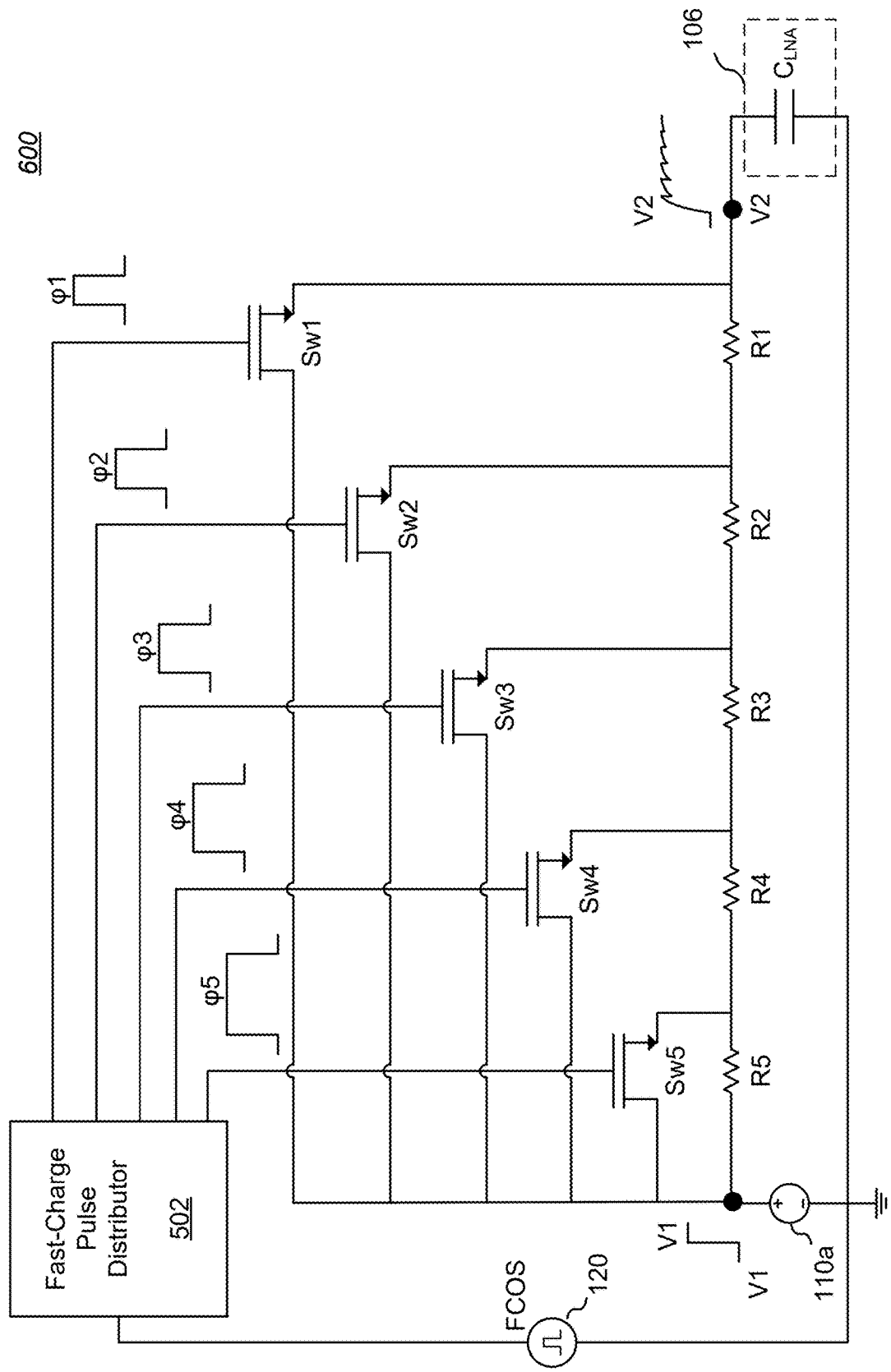
FIG. 6 is a schematic diagram of a third LNA bias circuit having a fast-charge pulse shaping circuit that staggers the release of multiple fast-charge pulses over multiple resistor segments.

FIG. 6 is a schematic diagram of a third LNA bias circuit 600 having a fast-charge pulse shaping circuit that staggers the release of multiple fast-charge pulses over multiple resistor segments. The third LNA bias circuit 600 is similar in most aspects to the LNA bias circuit 500 of FIG. 5. One difference is that one terminal of all of the switches Sw1-Sw5 are connected to node V1 in this example. While output pulse 1 is high, switch Sw1 bypasses all of the resistors R1-R5. When output pulse φ1 returns to a low state, resistor R1 is in series between the first bias circuit 110a and node V2. While output pulse φ2 is high (for longer than output pulse φ1), switch Sw2 bypasses all of the resistors R2-R5. When output pulse φ2 returns to a low state, resistor R2 is also in series between the first bias circuit 110a and node V2.

Resistors R3-R5 are progressively added in series between the first bias circuit 110a and node V2 as output pulses φ3-φ5 return to a low state from a high state. In the illustrated example, a single FCOS circuit 120 provides a fast-charge pulse to a fast-charge pulse distributor 502 which generates and outputs a set of output pulses φ1-φ5 to respective ones of the control gates of the bypass switches Sw1-Sw5. However, multiple FCOS circuits 120, as in FIG. 4, may be used as well.

As should be clear, the sequence of switching of bypass switches Sw1-Sw5 may be varied from the above descriptions; for example, output pulses φ1-φ5 may be respectively applied to switches Sw5-Sw1 rather than to switches Sw1-Sw5. Further, fewer or more than 5 switch/resistor pairs may be used in particular embodiments, and more than one resistor may be bypassed by a single switch (e.g., switch Sw5 may be omitted and switch Sw4 may span—and thus be able to bypass-resistors R5 and R5).

Figure 7:
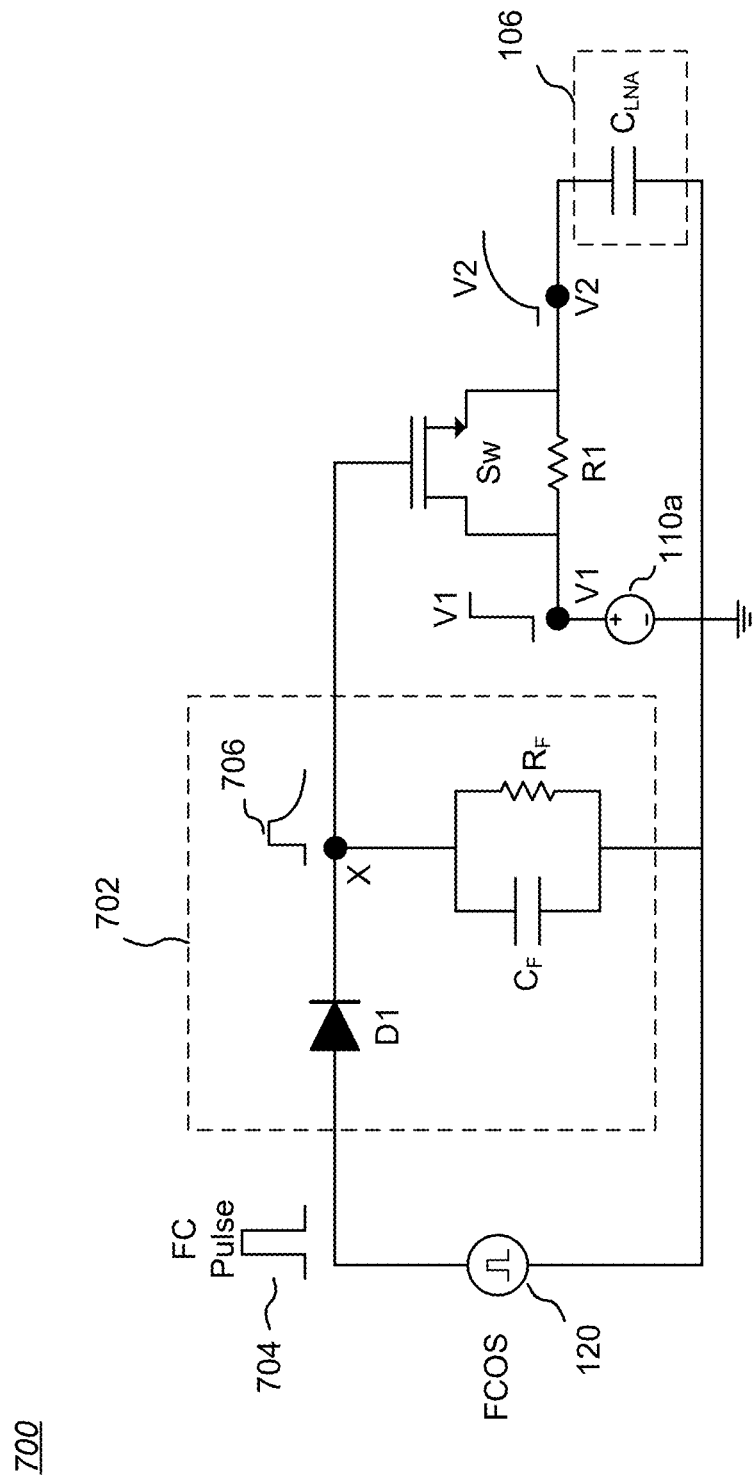
FIG. 7 is a schematic diagram of a fourth LNA bias circuit having a fast-charge pulse shaping circuit that moderates turn-off of a bypass switch Sw using a first type of filter circuit.

FIG. 7 is a schematic diagram of a fourth LNA bias circuit 700 having a fast-charge pulse shaping circuit that moderates turn-off of a bypass switch Sw using a first type of filter circuit 702. The filter circuit 702 includes a diode D1 having an input coupled to the output of an FCOS circuit 120 and an output coupled at a node X. The output of the FCOS circuit 120 is triggered by a controller 124 (see, e.g., FIG. 1) at the same time as a change at node V1 (both are controlled by the same digital control block). Coupled between node X and a reference potential (e.g., circuit ground) is a parallel combination of a filter capacitor $C_F$ and a filter resistor $R_F$. Node X is also coupled to the control gate of bypass switch Sw.

In essence, the LNA bias circuit 700 causes a fast-charge pulse to be filtered to rise quickly and fall slowly. For example, assume that the FCOS circuit 120 is between outputting fast-charge pulses 704 and that node X is discharged. When a fast-charge pulse 704 rises (at essentially the same time as the assertion of a low-to-high transition at node V1), the diode D1 is forward biased, and the filter capacitor $C_F$ is quickly charged, causing the node X voltage 706 to rapidly rise. Consequently, bypass switch Sw is turned ON, bypassing resistor R1. The result is that node V1 is coupled to node V2 directly, with only the slight ON resistance $R_{ON}$ of bypass switch Sw impeding flow of charge from node V1 to node V2. Rapid transfer of charge to node V2 charges the capacitor $C_{LNA}$.

When the fast-charge pulse 704 falls, the diode D1 is reverse biased and the filter capacitor $C_F$ is slowly discharged, causing the voltage 706 at node X to slowly fall. Consequently, bypass switch Sw will transition from an ON state to an OFF state more smoothly and slowly. The amount of resistance between nodes V1 and V2 is increased gradually until the resistance of resistor R1 dominates the circuit characteristics. The gradual state transition of bypass switch Sw allows the final state of the LNA (modeled by capacitor $C_{LNA}$) to be reached faster than if the fast-charge pulse were directly applied to the bypass switch Sw and ended abruptly. The settling time of the LNA is less dependent on bias resistance, enabling an NF improvement.

As should be clear, the filter comprising capacitor $C_F$ and resistor $R_F$ may be implemented with other filter types that include some element that can be rapidly charged and slowly discharged.

Figure 8:
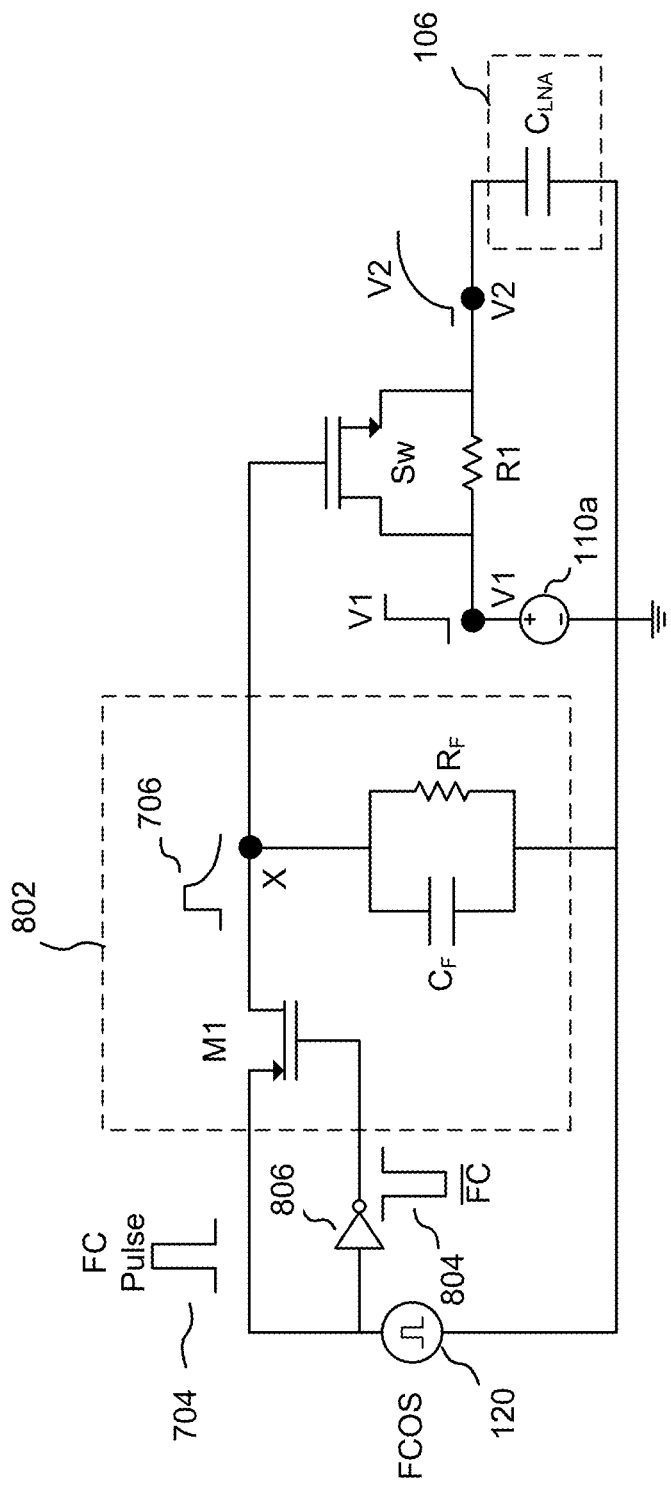
FIG. 8 is a schematic diagram of a fifth LNA bias circuit having a fast-charge pulse shaping circuit that moderates turn-off of a bypass switch Sw using a second type of filter circuit.

FIG. 8 is a schematic diagram of a fifth LNA bias circuit 800 having a fast-charge pulse shaping circuit that moderates turn-off of a bypass switch Sw using a second type of filter circuit 802. The diode D1 in the filter circuit 702 of FIG. 7 may be replaced by a P-type FET (PFET) switch and a complementary fast-charge pulse $\overline{FC}$. More specifically, the filter circuit 802 includes a PFET switch M1 having its conduction channel (between source and drain) coupled between the output of an FCOS circuit 120 and a node X. The control gate of PFET switch M1 is coupled to an inverter 806 that outputs an inverted version $\overline{FC}$ of an asserted fast-charge pulse 704. Coupled between node X and a reference potential (e.g., circuit ground) is a parallel combination of a filter capacitor $C_F$ and a filter resistor $R_F$. Node X is also coupled to the control gate of bypass switch Sw.

The fast-charge pulse 704 output of the FCOS circuit 120 is triggered by a controller 124 (see, e.g., FIG. 1) at the same time as a change at node V1 (both are controlled by the same digital control block). When the fast-charge pulse 704 rises, $\overline{FC}$ falls, causing PFET switch M1 to turn ON (conduct). Filter capacitor $C_F$ is quickly charged, causing the node X voltage 706 to rapidly rise. Consequently, bypass switch Sw is turned ON, bypassing resistor R1. The result is that node V1 is coupled to node V2 directly, with only the slight ON resistance $R_{ON}$ of bypass switch Sw impeding flow of charge from node V1 to node V2. Rapid transfer of charge to node V2 charges the capacitor $C_{LNA}$.

When the fast-charge pulse 704 falls, $\overline{FC}$ rises, causing PFET switch M1 to turn OFF. The filter capacitor $C_F$ slowly discharges, causing the voltage 706 at node X to slowly fall. Consequently, bypass switch Sw will transition from an ON state to an OFF state more slowly and smoothy. The amount of resistance between nodes V1 and V2 is increased gradually until the resistance of resistor R1 dominates the circuit characteristics. The gradual state transition of bypass switch Sw allows the final state of the LNA (modeled by capacitor $C_{LNA}$) to be reached faster than if the fast-charge pulse were directly applied to the bypass switch Sw and ended abruptly. The settling time of the LNA is less dependent on bias resistance, enabling an NF improvement.

An advantage of the LNA bias circuit 800 of FIG. 8 compared to the LNA bias circuit 700 of FIG. 7 is that use of the PFET switch M1 minimizes the voltage dropped across the rectifying device (diode D1 versus PFET switch M1).

Figure 9:
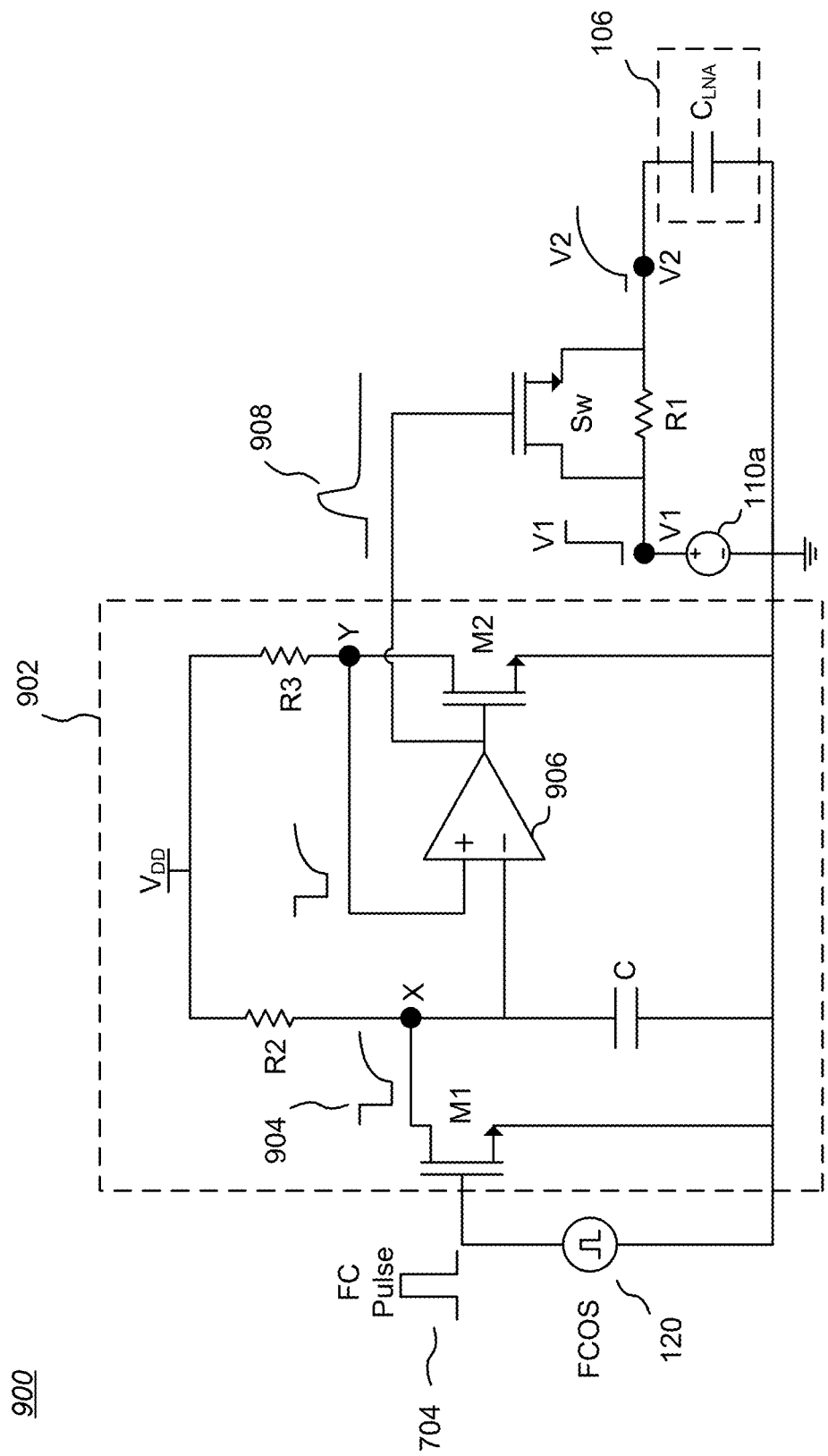
FIG. 9 is a schematic diagram of a sixth LNA bias circuit having a fast-charge pulse shaping circuit that moderates turn-off of a bypass switch Sw using an active timer and op-amp circuit.

FIG. 9 is a schematic diagram of a sixth LNA bias circuit 900 having a fast-charge pulse shaping circuit that moderates turn-off of a bypass switch Sw using an active timer and op-amp circuit 902. A timer subcircuit comprises a resistor R2 and a capacitor C coupled in series between a supply voltage $V_{DD}$ and a reference potential (e.g., circuit ground). A FET M1 has its conduction channel coupled between a node X and the reference potential. When a fast-charge pulse 704 rises, FET M1 conducts, pulling node X to the reference potential and discharging capacitor C. Conversely, when a fast-charge pulse 704 falls, FET M1 turns OFF, allowing capacitor C to slowly charge through resistor R2. The result is that the voltage 904 at node X is inverted with respect to the fast-charge pulse 704 and has a gradually transitioning trailing edge.

An operational amplifier (op-amp) subcircuit comprises an op-amp 906 having a negative input coupled to node X and a positive input coupled to a node Y between a resistor R3 and the conduction channel of a FET M2. Resistor R3 and the conduction channel of FET M2 are coupled in series between the supply voltage $V_{DD}$ and the reference potential. The output of the op-amp 906 is coupled to the control gate of FET M2 and to the control gate of bypass switch Sw. The resistor R3 and FET M2 are essentially replicas of bypass switch Sw. The timer subcircuit and the op-amp 906 set the ratio of resistance between the replica resistor R3 and replica transistor M2. The (time-varying) resistance of the replica transistor M2 is mirrored over to bypass switch Sw. More specifically, the pulsed waveform at node X is reproduced at node Y. The output of the op-amp 906 is a pulse 908 that is essentially an inverted and modified version of the voltage 904 at node X. The op-amp pulse 908 is applied to the control gate of bypass switch Sw to control the resistance of Sw, which is fully ON initially and then increases in resistance as the pulse 908 falls towards 0V. Note that the gate voltage applied to switch Sw ideally would return to 0V, but the circuit works even if the voltage simply goes below the threshold voltage of switch Sw. The result is that the resistance of the bypass switch Sw is precisely controlled and perturbations are minimized. The settling time of the LNA is less dependent on bias resistance, enabling an NF improvement.

Note that while the examples shown in FIGS. 4-9 and the accompanying description have focused on charging node V2, the same circuitry may be used to discharge node V2.

FIGS. 10-13 are graphs of relative gain as a function of time for different LNA bias circuit configurations.

Figure 10:
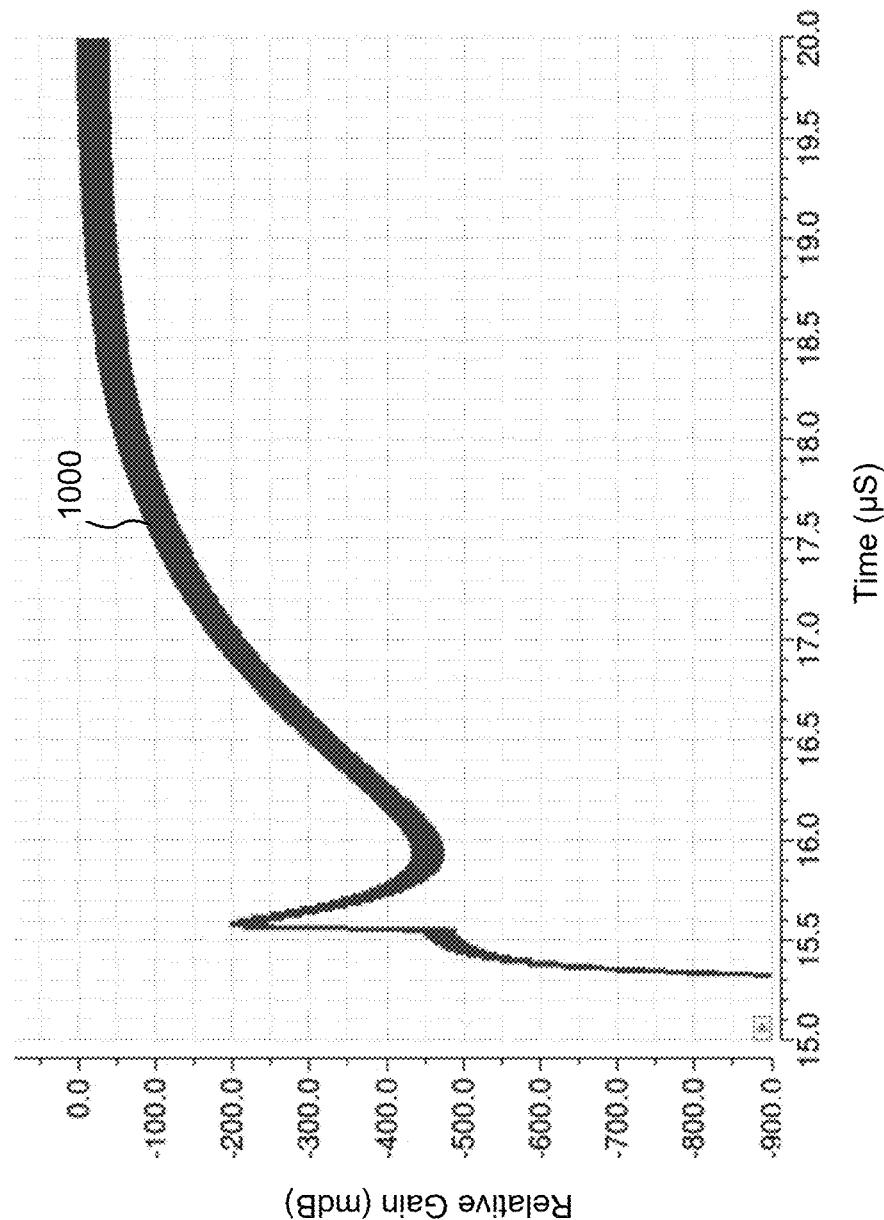
FIGS. 10-13 are graphs of relative gain as a function of time for different LNA bias circuit configurations.

FIG. 10 represents relative gain versus time for a reference LNA having an unmodified FCOS circuit 120 circuit like the example shown in FIG. 1. Graph line 1000 is essentially the same as graph line 304 in FIG. 3 and exhibits the same prominent "kink" between about 15.5 and 16.5 µS.

Figure 11:
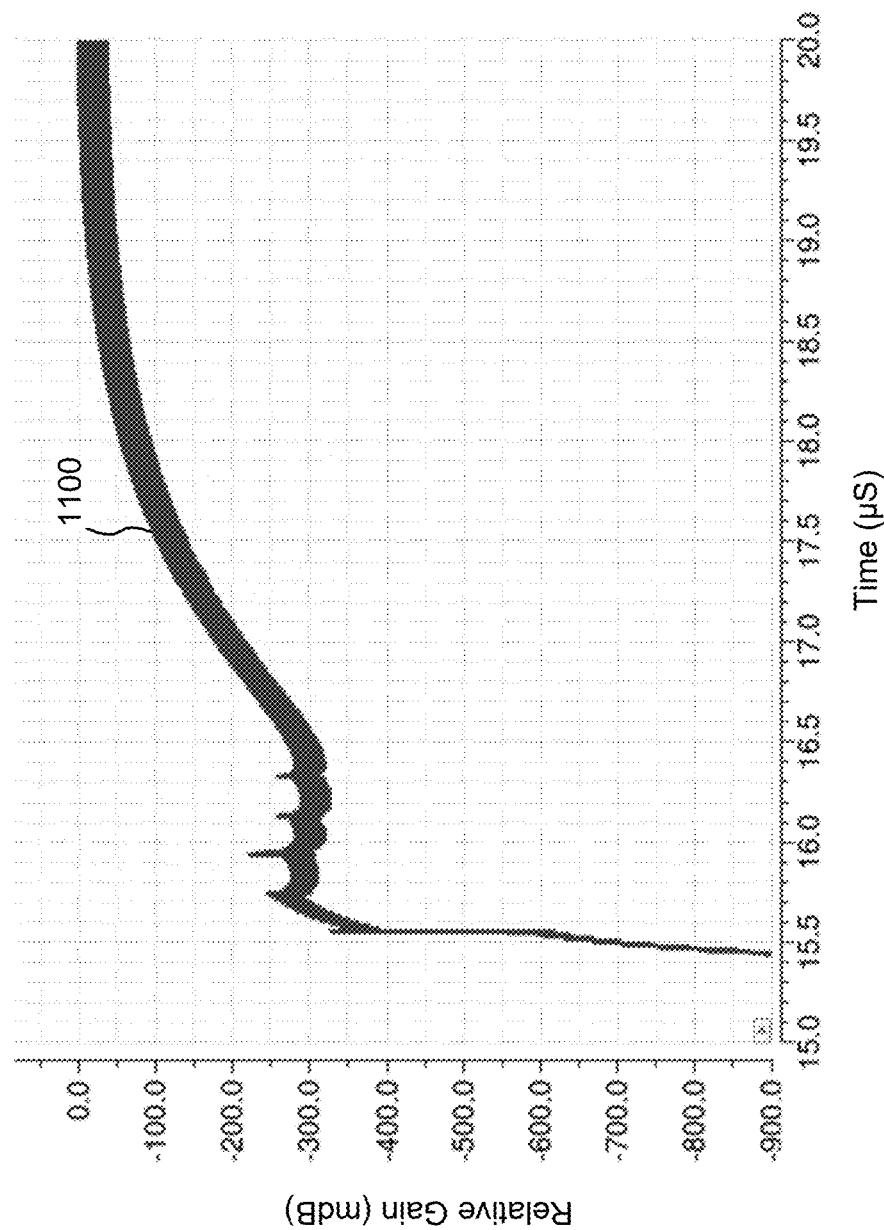

FIG. 11 represents relative gain versus time for an LNA having a multiple-resistor segmented bias circuit like the embodiments shown in FIGS. 4-6. The prominent "kink" shown for the reference circuit in FIG. 10 is absent in graph line 1100, which exhibits only minor perturbations between about 15.5 and 16.5 µS.

Figure 12:
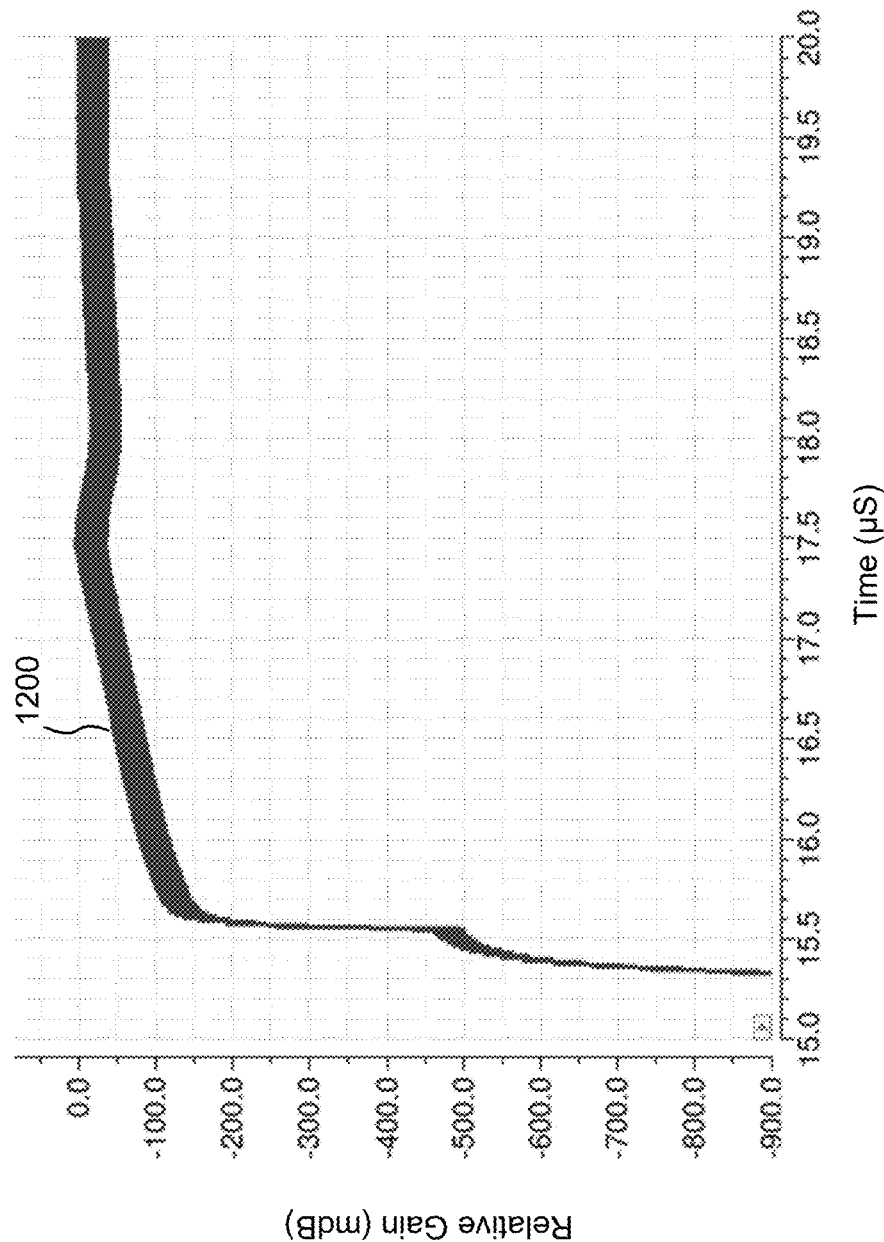

FIG. 12 represents relative gain versus time for an LNA having a diode-based bias circuit like the embodiments shown in FIGS. 7 and 8. The prominent "kink" shown for the reference circuit in FIG. 10 is absent in graph line 1200, which exhibits only one minor perturbation after about 15.5 µS.

Figure 13:
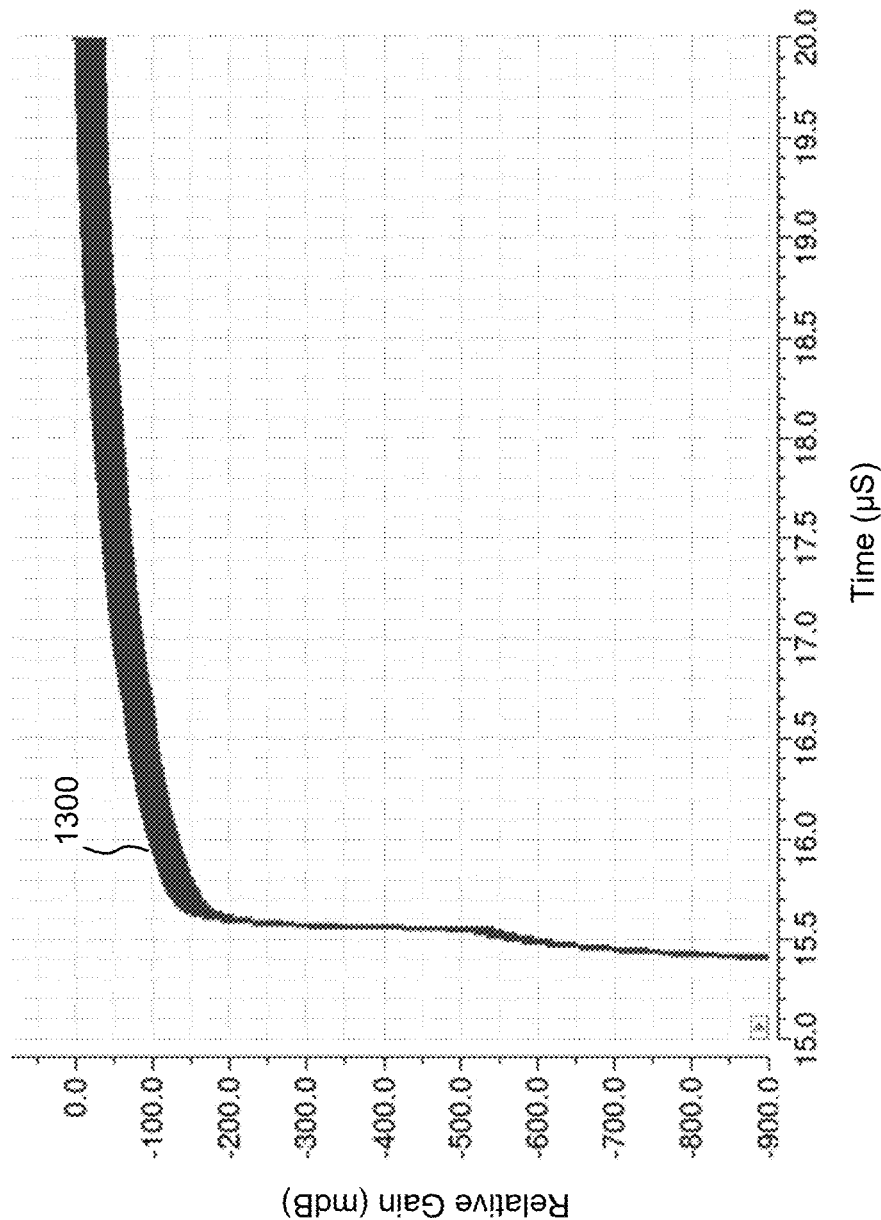

FIG. 13 represents relative gain versus time for an LNA having an active timer and op-amp bias circuit like the embodiment shown in FIG. 9. The prominent "kink" shown for the reference circuit in FIG. 10 is absent in graph line 1300, which exhibits essentially no perturbations after about 15.5 µS.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 14:
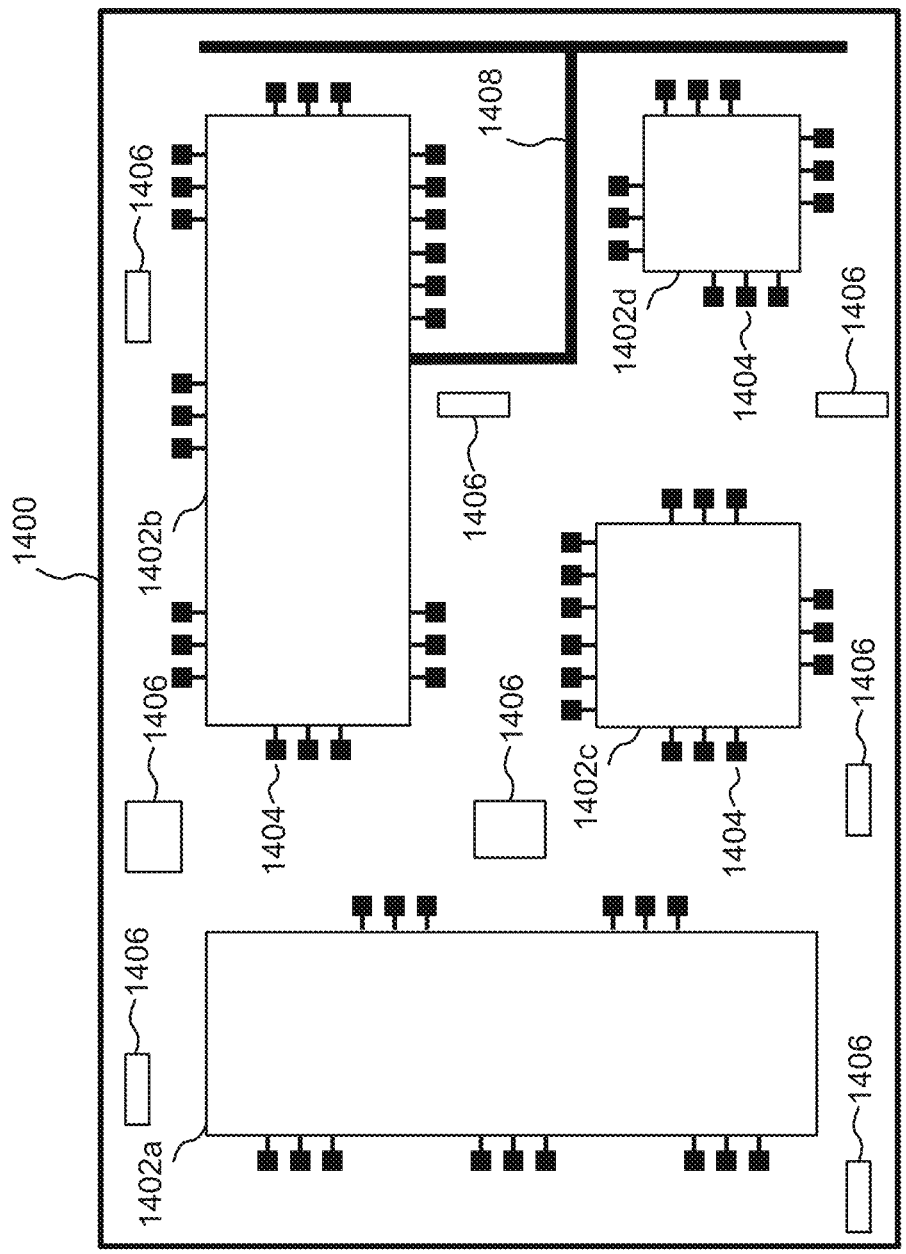
FIG. 14 is a top plan view of a substrate that may be, for example, a printed circuit board or chip module substrate (e.g., a thin-film tile).

As one example of further integration of embodiments of the present invention with other components, FIG. 14 is a top plan view of a substrate 1400 that may be, for example, a printed circuit board or chip module substrate (e.g., a thin-film tile). In the illustrated example, the substrate 1400 includes multiple ICs 1402a-1402d having terminal pads 1404 which would be interconnected by conductive vias and/or traces on and/or within the substrate 1400 or on the opposite (back) surface of the substrate 1400 (to avoid clutter, the surface conductive traces are not shown and not all terminal pads are labelled). The ICs 1402a-1402d may embody, for example, signal switches, active and/or passive filters, amplifiers (including one or more LNAs), and other circuitry.

The substrate 1400 may also include one or more passive devices 1406 embedded in, formed on, and/or affixed to the substrate 1400. While shown as generic rectangles, the passive devices 1406 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 1400 to other passive devices 1406 and/or the individual ICs 1402a-1402d.

The front or back surface of the substrate 1400 may be used as a location for the formation of other structures. For example, one or more antennae may be formed on or affixed to the front or back surface of the substrate 1400; one example of a front-surface antenna 1408 is shown, coupled to an IC die 1402b, which may include $R_F$ front-end circuitry. Thus, by including one or more antennae on the substrate 1400, a complete radio may be created.

Embodiments of the present invention are useful in a wide variety of larger radio frequency ($R_F$) circuits and systems for performing a range of functions, including (but not limited to) impedance matching circuits, $R_F$ power amplifiers, $R_F$ low-noise amplifiers (LNAs), phase shifters, attenuators, antenna beam-steering systems, charge pump devices, $R_F$ switches, etc. Such functions are useful in a variety of applications, such as radar systems (including phased array and automotive radar systems), radio systems (including cellular radio systems), and test equipment.

Radio system usage includes wireless $R_F$ systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Figure 15:
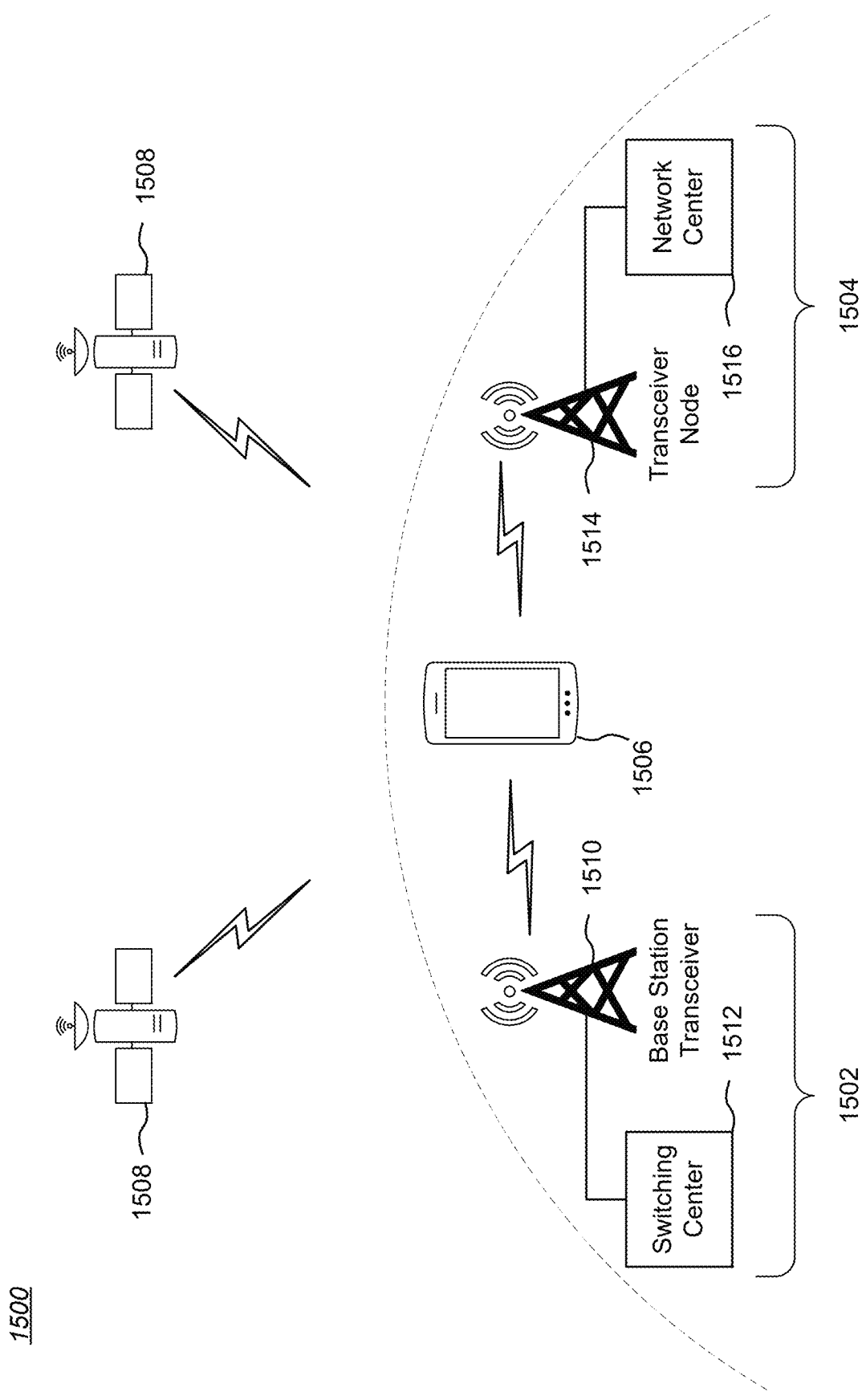
FIG. 15 illustrates a prior art wireless communication environment comprising different wireless communication systems, and which may include one or more mobile wireless devices.

As an example of wireless $R_F$ system usage, FIG. 15 illustrates a prior art wireless communication environment 1500 comprising different wireless communication systems 1502 and 1504, and which may include one or more mobile wireless devices 1506. A wireless device 1506 may be a cellular phone, a wireless-enabled computer or tablet, or some other wireless communication unit or device. A wireless device 1506 may also be referred to as a mobile station, user equipment, an access terminal, or some other terminology known in the telecommunications industry.

A wireless device 1506 may be capable of communicating with multiple wireless communication systems 1502, 1504 using one or more of telecommunication protocols such as the protocols noted above. A wireless device 1506 also may be capable of communicating with one or more satellites 1508, such as navigation satellites (e.g., GPS) and/or telecommunication satellites. The wireless device 1506 may be equipped with multiple antennas, externally and/or internally, for operation on different frequencies and/or to provide diversity against deleterious path effects such as fading and multi-path interference.

The wireless communication system 1502 may be, for example, a CDMA-based system that includes one or more base station transceivers (BSTs) 1510 and at least one switching center (SC) 1512. Each BST 1510 provides over-the-air $R_F$ communication for wireless devices 1506 within its coverage area. The SC 1512 couples to one or more BSTs 1510 in the wireless system 1502 and provides coordination and control for those BSTs 1510.

The wireless communication system 1504 may be, for example, a TDMA-based system that includes one or more transceiver nodes 1514 and a network center (NC) 1516. Each transceiver node 1514 provides over-the-air $R_F$ communication for wireless devices 1506 within its coverage area. The NC 1516 couples to one or more transceiver nodes 1514 in the wireless system 1504 and provides coordination and control for those transceiver nodes 1514.

In general, each BST 1510 and transceiver node 1514 is a fixed station that provides communication coverage for wireless devices 1506, and may also be referred to as base stations or some other terminology known in the telecommunications industry. The SC 1512 and the NC 1516 are network entities that provide coordination and control for the base stations and may also be referred to by other terminologies known in the telecommunications industry.

Figure 16:
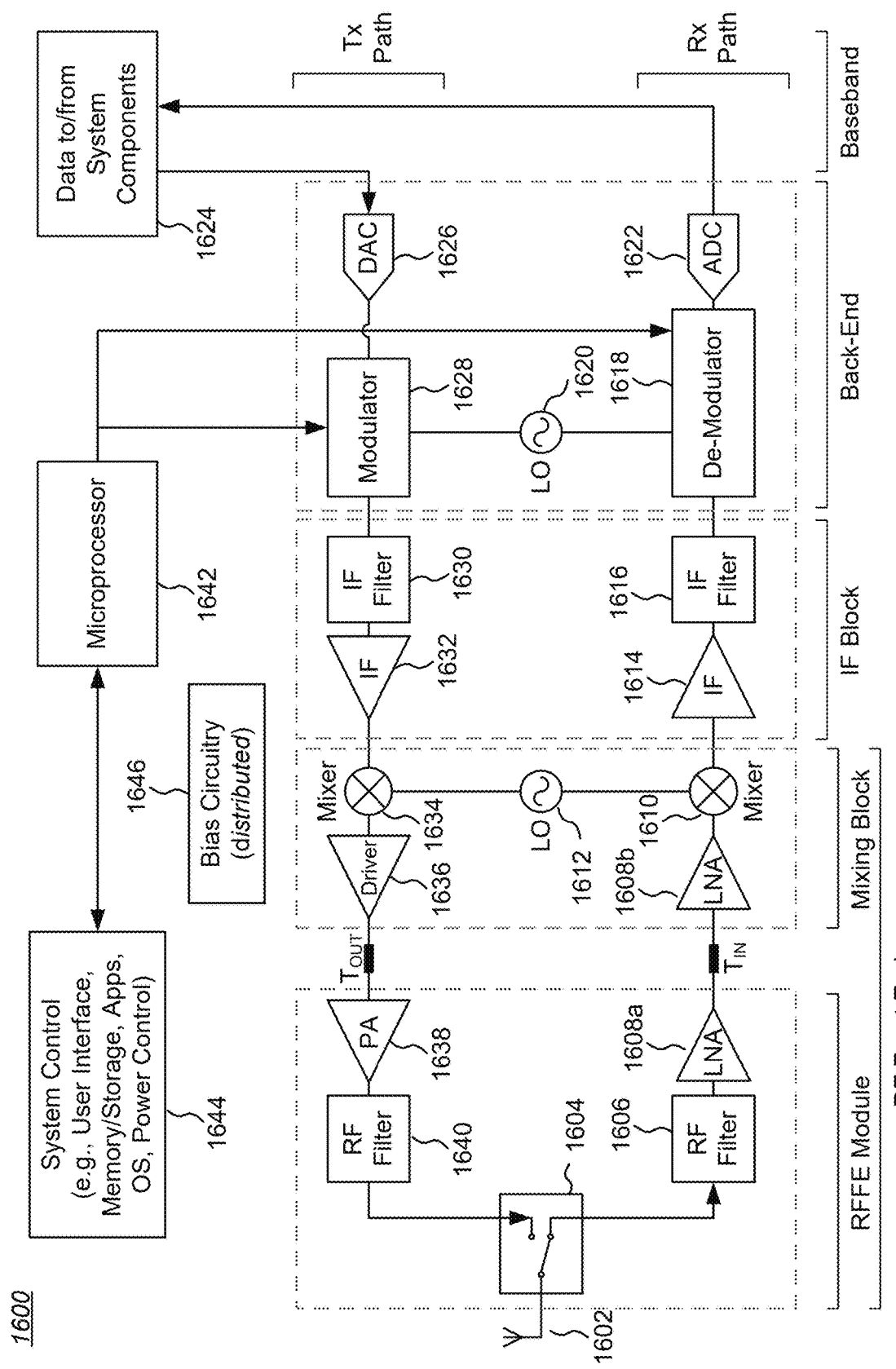
FIG. 16 is a block diagram of a transceiver that might be used in a wireless device, such as a cellular telephone, and which may beneficially incorporate an embodiment of the present invention for improved performance.

An important aspect of any wireless system, including the systems shown in FIG. 15, is in the details of how the component elements of the system perform. FIG. 16 is a block diagram of a transceiver 1600 that might be used in a wireless device, such as a cellular telephone, and which may beneficially incorporate an embodiment of the present invention for improved performance. As illustrated, the transceiver 1600 includes a mix of $R_F$ analog circuitry for directly conveying and/or transforming signals on an $R_F$ signal path, non-$R_F$ analog circuitry for operational needs outside of the $R_F$ signal path (e.g., for bias voltages and switching signals), and digital circuitry for control and user interface requirements. In this example, a receiver path Rx includes $R_F$ Front End (RFFE), Intermediate Frequency (IF) Block, Back-End, and Baseband sections (noting that in some implementations, the differentiation between sections may be different). The various illustrated sections and circuit elements may be embodied in one die or multiple IC dies. For example, the $R_F$ Front End in the illustrated example may include an RFFE module and a Mixing Block, which may be embodied in (or as part of) different IC dies or modules. The different dies and/or modules may be coupled by transmission lines $T_{IN}$ and $T_{OUT}$ (e.g., microstrips, co-planar waveguides, or an equivalent structure or circuit), either or both of which may have, for example, a 50Ω impedance.

The receiver path Rx receives over-the-air $R_F$ signals through at least one antenna 1602 and a switching unit 1604, which may be implemented with active switching devices (e.g., field effect transistors or FETs) and/or with passive devices that implement frequency-domain multiplexing, such as a diplexer or duplexer. An $R_F$ filter 1606 passes desired received $R_F$ signals to at least one low noise amplifier (LNA) 1608a, the output of which is coupled from the RFFE Module to at least one LNA 1608b in the Mixing Block (through transmission line $T_{IN}$ in this example). The LNA(s) 1608b may provide buffering, input matching, and reverse isolation. In some embodiments, the LNA(s) 1608a and 1608b may be a single LNA.

The output of the LNA(s) 1608b is combined in a corresponding mixer 1610 with the output of a first local oscillator 1612 to produce an IF signal. The IF signal may be amplified by an IF amplifier 1614 and subjected to an IF filter 1616 before being applied to a demodulator 1618, which may be coupled to a second local oscillator 1620. The demodulated output of the demodulator 1618 is transformed to a digital signal by an analog-to-digital converter 1622 and provided to one or more system components 1624 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and $R_F$ Front End sections (again, in some implementations, the differentiation between sections may be different). Digital data from one or more system components 1624 is transformed to an analog signal by a digital-to-analog converter 1626, the output of which is applied to a modulator 1628, which also may be coupled to the second local oscillator 1620. The modulated output of the modulator 1628 may be subjected to an IF filter 1630 before being amplified by an IF amplifier 1632. The output of the IF amplifier 1632 is then combined in a mixer 1634 with the output of the first local oscillator 1612 to produce an $R_F$ signal. The $R_F$ signal may be amplified by a driver 1636, the output of which is coupled to a power amplifier (PA) 1638 (through transmission line Tour in this example). The amplified $R_F$ signal may be coupled to an $R_F$ filter 1640, the output of which is coupled to at least one antenna 1602 through the switching unit 1604.

The operation of the transceiver 1600 is controlled by a microprocessor 1642 in known fashion, which interacts with system control components 1644 (e.g., user interfaces, memory/storage devices, application programs, operating system software, power control, etc.). In addition, the transceiver 1600 will generally include other circuitry, such as bias circuitry 1646 (which may be distributed throughout the transceiver 1600 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1600 may be positioned in a different order (e.g., filters) or omitted. Other components can be (and often are) added, such as (by way of example only) additional filters, impedance matching networks, variable phase shifters/attenuators, power dividers, etc.

Figure 17:
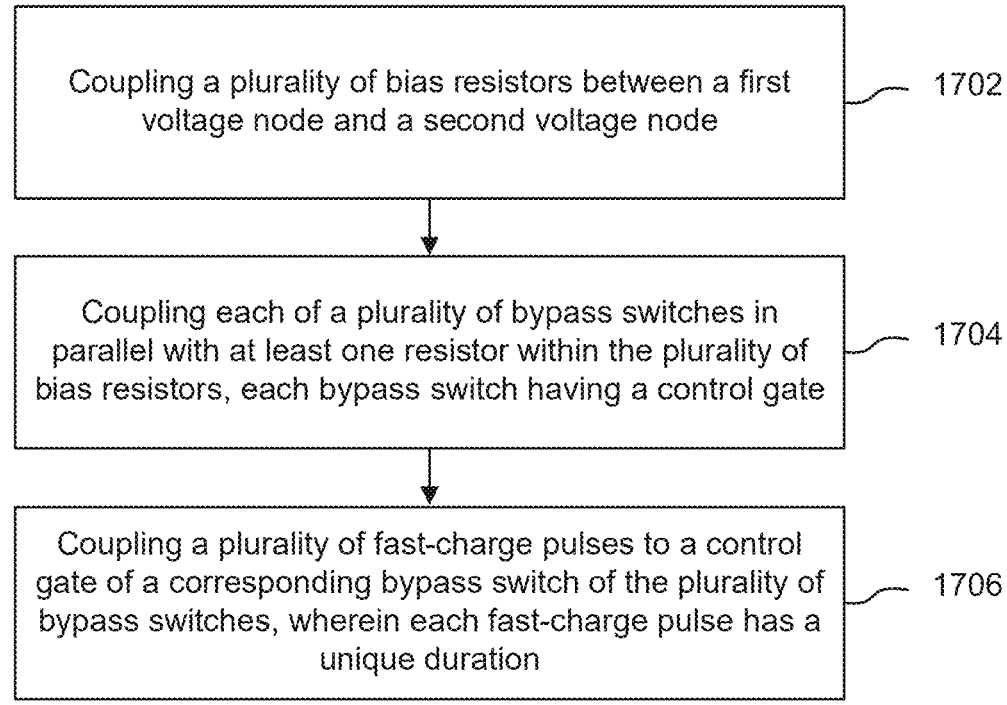
FIG. 17 is a process flow chart showing one method for controlling application of a fast-charge pulse to selectively change a resistance of a signal path between a first voltage node and a second voltage node.

Another aspect of the invention includes methods for controlling application of a fast-charge pulse or shaping a fast-charge pulse to selectively change resistance of a signal path between a first voltage node and a second voltage node. For example, FIG. 17 is a process flow chart 1700 showing one method for controlling application of a fast-charge pulse to selectively change resistance of a connected path between a first voltage node and a second voltage node. The method includes: coupling a plurality of bias resistors between the first voltage node and the second voltage node (Block 1702); coupling each of a plurality of bypass switches in parallel with at least one resistor within the plurality of bias resistors, each bypass switch having a control gate (Block 1704); and coupling a plurality of fast-charge pulses to a control gate of a corresponding bypass switch of the plurality of bypass switches, wherein each fast-charge pulse has a unique duration (Block 1706).

Figure 18:
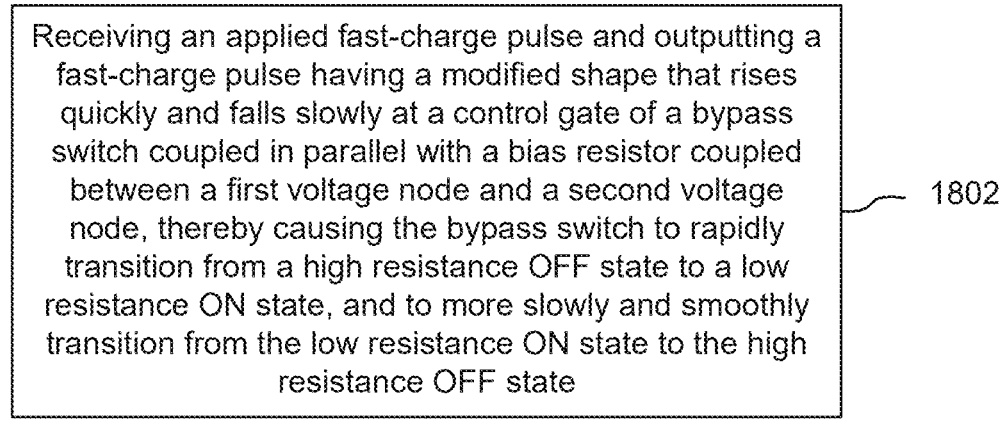
FIG. 18 is a process flow chart showing one method for modifying a fast-charge pulse to selectively change a resistance of a signal path between a first voltage node and a second voltage node.

As another example, FIG. 18 is a process flow chart 1800 showing one method for shaping a fast-charge pulse to selectively change resistance of a connected path between a first voltage node and a second voltage node. The method includes receiving an applied fast-charge pulse and outputting a fast-charge pulse having a modified shape that rises quickly and falls slowly at a control gate of a bypass switch coupled in parallel with a bias resistor coupled between a first voltage node and a second voltage node, thereby causing the bypass switch to rapidly transition from a high resistance OFF state to a low resistance ON state, and to more slowly and smoothly transition from the low resistance ON state to the high resistance OFF state (Block 1802).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" ($R_F$) refers to a rate of oscillation in the range of about 3 kHz to about 300 GHz. This term also includes the frequencies used in wireless communication systems. An $R_F$ frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A fast-charge pulse shaping circuit configured to receive an applied fast-charge pulse and output a fast-charge pulse having a shape that rises quickly and falls slowly at a control gate of a bypass switch coupled in parallel with a bias resistor between a first voltage node and a second voltage node, thereby causing the bypass switch to rapidly transition from a high resistance OFF state to a low resistance ON state, and to more slowly and smoothly transition from the low resistance ON state to the high resistance OFF state.

2. The fast-charge pulse shaping circuit of claim 1, further including:
    (a) a diode having an input configured to receive the applied fast-charge pulse and an output coupled to the control gate of the bypass switch; and
    (b) a filter coupled to the output of the diode and configured to be coupled to a reference potential, the filter including at least one element that can be rapidly charged and slowly discharged.

3. The fast-charge pulse shaping circuit of claim 2, wherein the filter includes a capacitor and resistor each coupled to the output of the diode and configured to be coupled to the reference potential.

4. The fast-charge pulse shaping circuit of claim 2, further including a fast-charge one-shot circuit configured to output the applied fast-charge pulse.

5. The fast-charge pulse shaping circuit of claim 1, further including:
   (a) a transistor having a conduction channel configured to receive the applied fast-charge pulse and coupled to the control gate of the bypass switch, and having a control gate coupled to an inverted version of the applied fast-charge pulse, the transistor having a conductive ON state when a negative voltage is applied to the control gate; and
   (b) a filter coupled to the control gate of the bypass switch and configured to be coupled to a reference potential, the filter including at least one element that can be rapidly charged and slowly discharged.

6. The fast-charge pulse shaping circuit of claim 5, wherein the filter includes a capacitor and resistor each coupled to the output of the diode and configured to be coupled to the reference potential.

7. The fast-charge pulse shaping circuit of claim 5, further including a fast-charge one-shot circuit configured to output the applied fast-charge pulse.

8. The fast-charge pulse shaping circuit of claim 1, further including:
   (a) a first resistor coupled to a first connection node and configured to be coupled to a voltage source;
   (b) a capacitor coupled to the first connection node and configured to be coupled to a reference potential;
   (c) a first transistor having a conduction channel coupled to the first connection node and configured to be coupled to the reference potential, and having a control gate configured to receive the applied fast-charge pulse;
   (d) a second resistor coupled to a second connection node and configured to be coupled to the voltage source;
   (e) a second transistor having a conduction channel coupled to the second connection node and configured to be coupled to the reference potential, and having a control gate; and
   (f) an operational amplifier having a first input coupled to the first connection node, a second input coupled to the second connection node, and an output coupled to the control gate of the second transistor and to the control gate of the bypass switch.

9. The fast-charge pulse shaping circuit of claim 8, further including a fast-charge one-shot circuit configured to output the applied fast-charge pulse.

10. The fast-charge pulse shaping circuit of claim 1, wherein the bypass switch is a field-effect transistor, and further including:
    (a) a diode having an input configured to receive the applied fast-charge pulse and an output coupled to the control gate of the bypass switch; and
    (b) a filter coupled to the output of the diode and configured to be coupled to a reference potential, wherein the filter includes a capacitor and resistor coupled in parallel.

11. The fast-charge pulse shaping circuit of claim 10, further including a fast-charge one-shot circuit configured to output the applied fast-charge pulse.

12. The fast-charge pulse shaping circuit of claim 1, wherein the bypass switch is a field-effect transistor, and further including:
    (a) a transistor having a conduction channel configured to receive the applied fast-charge pulse and coupled to the control gate of the bypass switch, and having a control gate coupled to an inverted version of the applied fast-charge pulse, the transistor having a conductive ON state when a negative voltage is applied to the control gate; and
    (b) a filter coupled to the control gate of the bypass switch and configured to be coupled to a reference potential, wherein the filter includes a capacitor and resistor coupled in parallel.

13. The fast-charge pulse shaping circuit of claim 12, further including a fast-charge one-shot circuit configured to output the applied fast-charge pulse.

14. The fast-charge pulse shaping circuit of claim 1, wherein the bypass switch is a field-effect transistor.

15. The fast-charge pulse shaping circuit of claim 2, wherein the filter includes a capacitor and resistor coupled in parallel.

16. The fast-charge pulse shaping circuit of claim 5, wherein the bypass switch is a field-effect transistor.

17. The fast-charge pulse shaping circuit of claim 5, wherein the filter includes a capacitor and resistor coupled in parallel.

18. The fast-charge pulse shaping circuit of claim 8, wherein the bypass switch is a field-effect transistor.

19. The fast-charge pulse shaping circuit of claim 8, wherein the bypass switch is a field-effect transistor, and further including a fast-charge one-shot circuit configured to output the applied fast-charge pulse.

20. The fast-charge pulse shaping circuit of claim 8, wherein the first input of the operational amplifier has a positive polarity and the second input of the operational amplifier has a negative polarity.

* * * * *